US009502652B2

(12) United States Patent
Imanaka et al.

(10) Patent No.: US 9,502,652 B2
(45) Date of Patent: Nov. 22, 2016

(54) METHOD OF MANUFACTURING EL DISPLAY DEVICE

(71) Applicant: PANASONIC CORPORATION, Osaka (JP)

(72) Inventors: Seiji Imanaka, Hyogo (JP); Kazuo Uetani, Hyogo (JP); Akira Takiguchi, Hyogo (JP)

(73) Assignee: JOLED INC, Tokyo (JP)

( * ) Notice: Subject to any disclaimer, the term of this patent is extended or adjusted under 35 U.S.C. 154(b) by 0 days.

(21) Appl. No.: 14/585,016

(22) Filed: Dec. 29, 2014

(65) Prior Publication Data
US 2015/0111323 A1 Apr. 23, 2015

Related U.S. Application Data

(63) Continuation of application No. PCT/JP2014/002157, filed on Apr. 16, 2014.

(30) Foreign Application Priority Data

Apr. 22, 2013 (JP) .................................. 2013-089023

(51) Int. Cl.
*H01L 51/00* (2006.01)
*H01L 27/32* (2006.01)
(Continued)

(52) U.S. Cl.
CPC ......... *H01L 51/0002* (2013.01); *C23C 14/243* (2013.01); *C23C 16/00* (2013.01); *H01L 27/3244* (2013.01); *H01L 51/001* (2013.01); *H01L 51/56* (2013.01)

(58) Field of Classification Search
CPC . H01L 51/001; H01L 51/56; H01L 51/0002; H01L 27/3244; H01L 21/6776; H01L 21/67173; H01L 21/67709; H01L 21/6831; C23C 16/00; C23C 14/12; C23C 14/042; C23C 14/50; C23C 14/56; C23C 14/243; C30B 29/403; C30B 23/005; C30B 23/066
USPC .............. 427/66; 117/89, 84, 109, 200, 201; 118/726, 724; 438/308, 378, 795
See application file for complete search history.

(56) References Cited

U.S. PATENT DOCUMENTS 5,449,883 A * 9/1995 Tsuruta ............... H01L 21/6776
219/121.43
6,770,137 B2 * 8/2004 Hara ....................... C30B 25/00
117/105
(Continued)

FOREIGN PATENT DOCUMENTS

JP          10-195639 A      7/1998
JP          2005-163090 A    6/2005
(Continued)

OTHER PUBLICATIONS

International Search Report issued in International Application No. PCT/JP2014/002157 dated Jun. 10, 2014, with English Translation.

*Primary Examiner* — Kenneth Parker
*Assistant Examiner* — Bo Fan
(74) *Attorney, Agent, or Firm* — McDermott Will & Emery LLP

(57) ABSTRACT

A method of manufacturing an EL display device having a panel part includes a step of forming film of an element constituting the panel part, by using a vapor deposition equipment. The vapor deposition equipment is equipped with crucible configured to accommodate vapor deposition material, metal case configured to dispose the crucible therein, and heater configured to heat vapor deposition material in the crucible. Case includes container and lid. Container is configured to accommodate crucible with a gap between the container and crucible. Lid is configured to be removably attached to an opening of container, and includes a jetting port through which vapors of vapor deposition material jet out.

11 Claims, 5 Drawing Sheets

(51) Int. Cl.
  *C23C 14/24* (2006.01)
  *C23C 16/00* (2006.01)
  *H01L 51/56* (2006.01)

(56) References Cited

U.S. PATENT DOCUMENTS

| | | | |
|---|---|---|---|
| 7,037,797 B1* | 5/2006 | Shooshtarian | H01L 21/67109 438/308 |
| 7,441,344 B1* | 10/2008 | Savarese | F26B 3/28 34/266 |
| 8,591,654 B2* | 11/2013 | Kitou | C30B 25/00 117/102 |
| 2004/0194694 A1* | 10/2004 | Sugiyama | C23C 16/325 117/200 |
| 2009/0017192 A1* | 1/2009 | Matsuura | C23C 14/042 427/66 |
| 2011/0030611 A1* | 2/2011 | Santailler | C30B 23/005 117/108 |
| 2011/0155051 A1* | 6/2011 | Hara | C30B 23/063 117/109 |
| 2011/0171462 A1* | 7/2011 | Satoh | C30B 29/403 428/332 |
| 2012/0000414 A1* | 1/2012 | Bondokov | C30B 23/002 117/84 |
| 2012/0024232 A1* | 2/2012 | Lee | C23C 14/243 118/726 |
| 2012/0086001 A1* | 4/2012 | Wang | C30B 29/16 257/43 |

FOREIGN PATENT DOCUMENTS

| | | | |
|---|---|---|---|
| JP | 2006-111920 A | | 4/2006 |
| JP | 2011-249089 A | | 12/2011 |
| JP | KR 20120111987 A | * | 10/2012 |
| JP | 2012-216373 A | | 11/2012 |

* cited by examiner

METHOD OF MANUFACTURING EL DISPLAY DEVICE

RELATED APPLICATIONS

This application is a Continuation of International Application No. PCT/JP2014/002157, filed on Apr. 16, 2014, which in turn claims the benefit of Japanese Application No. 2013-089023, filed on Apr. 22, 2013 the disclosures of which Applications are incorporated by reference herein.

BACKGROUND

1. Field

The present technology disclosed herein relates to methods of manufacturing EL display devices.

2. Description of the Related Art

In recent years, next-generation display devices have been actively developed. Among others, an EL (Electroluminescence) display device receives much attention which has a driving substrate on which first electrodes, a plurality of organic layers including light emitting layers, and second electrodes are laminated in this order. The EL display device features a wide viewing angle because of being self-luminous, power saving expectable due to no need for a backlight, high responsiveness, a thin depth of the device, and the like. For this reason, introduction of the EL display device has been strongly desired into applications for large screen display devices such as television receivers.

In applications of color display, a display technology using three-color pixels, i.e. red, blue, and green colors, is most commonly employed. Besides it, aiming at improving power saving, reliability, etc., developments of other display technologies have been advanced at various manufactures, by using four-color pixels, i.e. red, blue, green, and white colors, or alternatively red, blue, green, and light-blue colors or the like.

In an organic EL light-emitting element, it is required to form, for every pixel, an organic EL light-emitting part for each of three colors of red, blue, and green, or alternatively for each of four colors of such as red, blue, green, and white.

The most common process for forming discrete organic EL parts is such that a fine-metal mask having fine holes is used to form the organic EL parts only at locations corresponding to the holes, by vapor deposition through the mask. For example, a red-color fine-metal mask is used to form the organic EL parts to emit red light by vapor deposition through it; a green-color fine-metal mask is used to form the organic EL parts to emit green light by vapor deposition through it a blue-color fine-metal mask is used to form the organic EL parts to emit blue light by vapor deposition through it. This completes the light emitting parts to emit respective red, green, and blue light.

On the other hand, it is important to develop technology of organic EL light-emitting element which allows the use of a large size substrate, aiming at manufacturing large-size organic EL light-emitting elements and at reducing costs.

Recently, much attention has been paid to the following two methods of forming organic EL light-emitting elements through the use of a large size substrate.

One is such that white-color organic EL elements are formed over the entire region of display, and color display is performed by using a four-color filter for red, green, blue, and white colors. This method is effective in forming a large screen, a high definition display, and the like.

The other, an attention-getting method of forming organic EL light-emitting elements on a large size substrate, is such that organic EL light-emitting parts are formed by a coating method. As the coating method, various processes have been examined which can be divided broadly into two categories: That is, one includes relief printing, flexographic printing, screen printing, and gravure printing, and the other includes inkjet printing (see, Japanese Patent Unexamined Publication No. 2011-249089).

SUMMARY

The present technology disclosed herein is intended to provide a method of manufacturing an EL display device having a panel part. The panel part comprises a light emitting part in which a plurality of pixels are arrayed, and a thin-film transistor array device to control light emission of the light emitting part. The method comprises forming an element that constitutes the panel part by using a vapor deposition equipment. The vapor deposition equipment includes a crucible configured to accommodate a vapor deposition material, a metal case configured to dispose the crucible therein, and a heating unit configured to heat the vapor deposition material in the crucible. The case includes a container configured to accommodate the crucible with a gap between the container and the crucible, and a lid configured to be removably attached to an opening of the container and having jetting ports for vapors of the vapor deposition material to jet out. The crucible is supported by a supporter with a gap between the crucible and a bottom part of the container of the case, and with a smaller contact area, at where the crucible contacts the bottom part of the container, than an area of a bottom part of the crucible.

In accordance with the present technology, it is possible to improve yields in manufacturing the EL display devices.

DETAILED DESCRIPTION

Hereinafter, descriptions will be made regarding a method of manufacturing an EL display device according to an embodiment of the present technology disclosed herein, with reference to FIGS. 1 to 5 of the accompanying drawings. It is noted, however, that descriptions in more detail than necessary will sometimes be omitted. For example, detailed descriptions of well-known items and duplicate descriptions of substantially the same configuration will sometimes be omitted, for the sake of brevity of the following descriptions and easy understanding by those skilled in the art.

Note that the accompanying drawings and the following descriptions are provided herein to facilitate fully understanding of the present disclosure by those skilled in the art, and are in no way intended to impose any limitation on the subject matter set forth in the appended claims.

Figure 1:
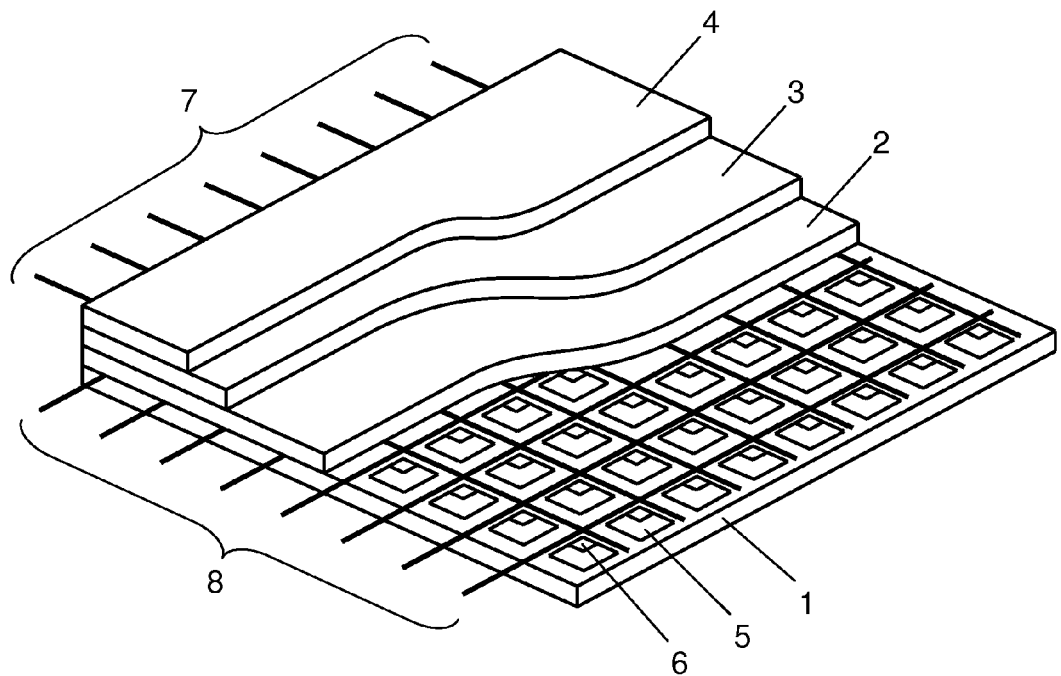
FIG. 1 is a schematic perspective view of a configuration of an organic EL display device according to an embodiment of the present technology disclosed herein.
Figure 2:
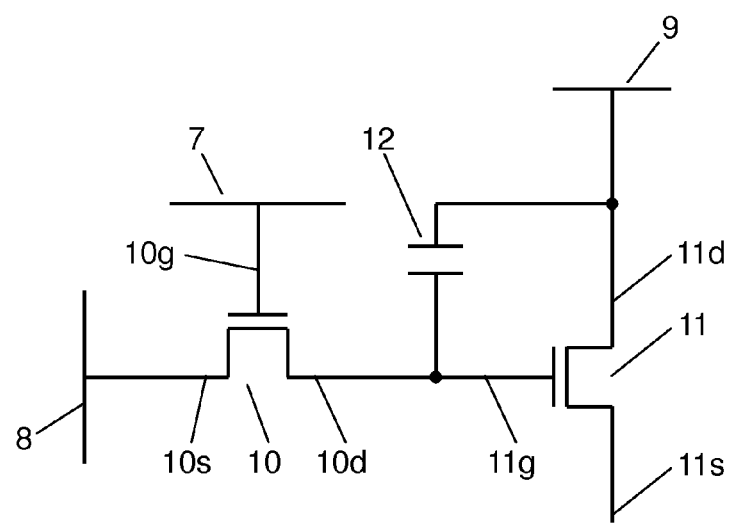
FIG. 2 is an electric circuit diagram of a circuit configuration of a pixel circuit that drives a pixel.

FIG. 1 is a schematic perspective view of a configuration of an organic EL display device according to the embodiment of the present technology. FIG. 2 is a view of a circuit configuration of a pixel circuit that drives a pixel.

As shown in FIGS. 1 and 2, the organic EL display device is configured having a laminated structure in which thin-film transistor array device 1 and light emitting part are laminated in this order from the lower layer. Thin-film transistor array device 1 includes a plurality of thin-film transistors. The light emitting part includes anode 2 serving as a lower electrode, light emitting layer 3 composed of an organic material, and cathode 4 serving as a transparent upper electrode. Light emission of the light emitting part is controlled by thin-film transistor array device 1. Moreover, the light emitting part has a configuration in which light emitting layer 3 is disposed between anode 2 and cathode 4 serving as a pair of electrodes. Between anode 2 and light emitting layer 3, a hole transport layer is formed by lamination. Between light emitting layer 3 and transparent cathode 4, an electron transport layer is formed by lamination. In thin-film transistor array device 1, a plurality of pixels 5 are disposed in a matrix.

Each of pixels 5 is driven by pixel circuit 6 that is disposed for the each. Moreover, thin-film transistor array device 1 includes a plurality of gate wirings 7 disposed in rows, a plurality of source wirings 8 serving as signal wirings disposed in columns to intersect with gate wirings 7, and a plurality of power supply wirings 9 (omitted in FIG. 1) extending in parallel with source wirings 8.

Gate wirings 7 connect, for every row, with gate electrodes 10g of thin-film transistors 10 which each operate as a switching element included in each of pixel circuits 6. Source wirings 8 connect, for every column, with source electrodes 10s of thin-film transistors 10 which each operate as a switching element included in each of pixel circuits 6. Power supply wirings 9 connect, for every column, with drain electrodes 11d of thin-film transistors 11 which each operate as a driving element included in each of pixel circuits 6.

As shown in FIG. 2, each of pixel circuits 6 is configured with thin-film transistor 10 operating as the switching element, thin-film transistor 11 operating as the driving element, and capacitor 12 storing data to be displayed at the corresponding pixels.

Thin-film transistor 10 is configured with gate electrode 10g connected to gate wiring 7, source electrode 10s connected to source wiring 8, drain electrode 10d connected to both capacitor 12 and gate electrode 11g of thin-film transistor 11, and a semiconductor film (not shown). Upon applying voltages to gate wiring 7 and source wiring 8 both connected to thin-film transistor 10, the transistor 10 stores, in capacitor 12, the value of the voltage applied to source wiring 8, with the value being as display data.

Thin-film transistor 11 is configured with gate electrode 11g connected to drain electrode 10d of thin-film transistor 10, drain electrode 11d connected to both power supply wiring 9 and capacitor 12, source electrode 11s connected to anode 2, and a semiconductor film (not shown). Thin-film transistor 11 supplies current corresponding to the voltage value stored in capacitor 12, to anode 2 from power supply wiring 9 via source electrode 11s. That is, the EL display device with the configuration described above employs an active matrix system in which display control is performed for every pixel 5 that is located at an intersection of gate wiring 7 and source wiring 8.

Moreover, in the EL display device, the light emitting parts that emit light of at least red, green, and blue lights are such that a plurality of sub-pixels is disposed in a matrix to form the plurality of the pixels. The sub-pixels have the respective light emitting layers to emit respective light of at least red light (R), green light (G), and blue light (B). The sub-pixels constituting each pixel are separated from each other by banks. The banks are formed in such a manner that protruded ribs extending in parallel with gate wirings 7 and protruded ribs extending in parallel with source wiring 8 are formed to intersect with each other. Then, in portions surrounded by the respective protruded ribs, i.e. in openings of the banks, the sub-pixels having the respective light emitting layers of R, G, and B are formed.

Figure 3:
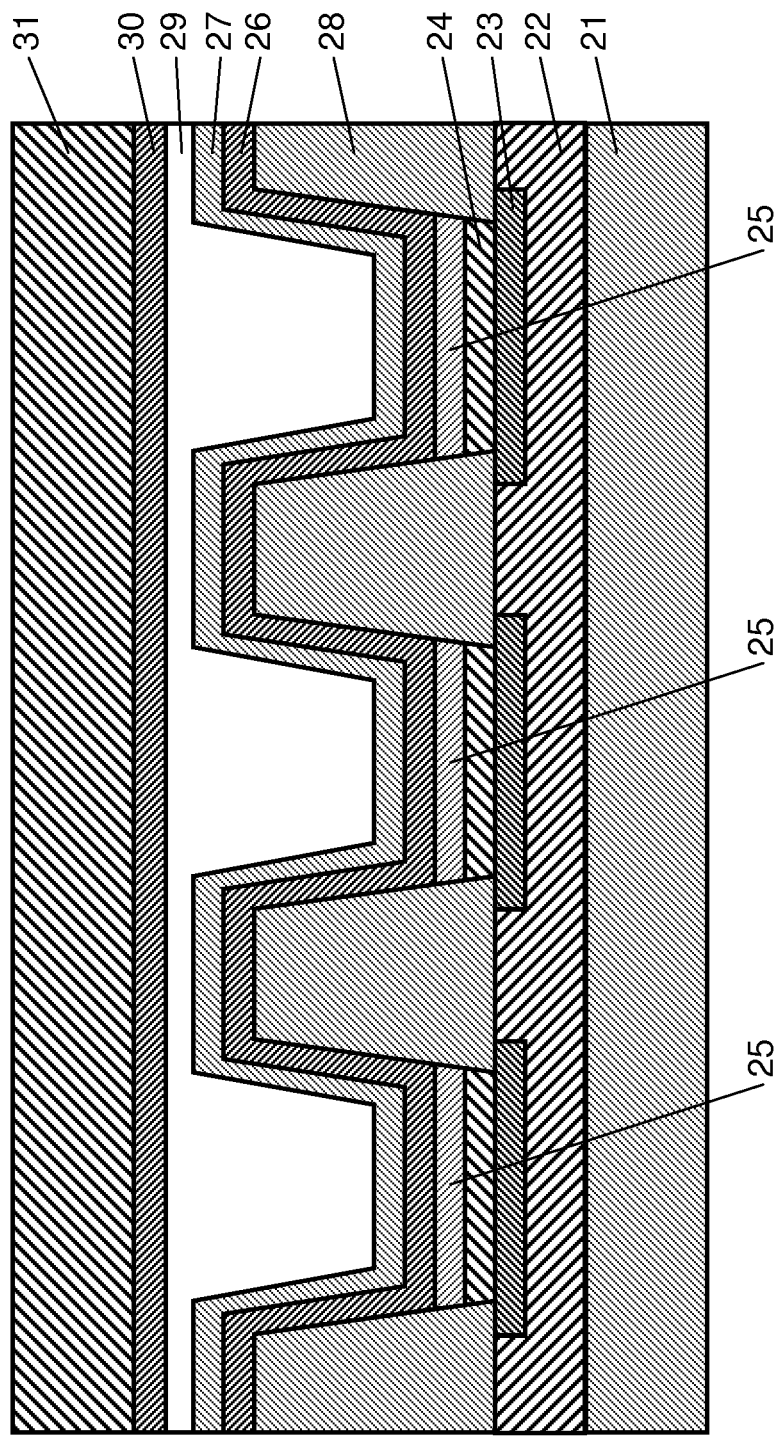
FIG. 3 is a cross-sectional view of a cross-sectional structure of sub-pixel portions of R, G, and B, in the EL display device.

FIG. 3 is a cross-sectional view of a cross-sectional structure of the sub-pixel portions of R, G, and B, in the EL display device. As shown in FIG. 3, the panel part of the EL display device is such that, on base substrate 21 such as a glass substrate or a flexible resin substrate, thin-film transistor array device 22 is formed which constitutes pixel circuits 6 described above. In addition, on thin-film transistor array device 22, anodes 23 serving as the lower electrodes are formed via a planarization insulating film (not shown). Then, on top of the anodes 23, there are laminated hole transport layer 24, light emitting layer 25 composed of the respective organic material to emit light of R, G, or B, electron transport layer 26, and cathode 27 serving as the transparent upper electrode, in this order. This constitutes the organic EL light-emitting parts of R, G, and B.

Moreover, each of light emitting layers 25 of the light emitting parts is formed in a region partitioned by banks 28 that are insulating layers. Banks 28 are intended to partition the light emitting region into predetermined shapes as well as to ensure the insulation between anodes 23 and cathodes 27. The banks are composed of a photosensitive resin including silicon oxide and polyimide, for example.

Note that, in the embodiment described above, only hole transport layers 24 and electron transport layers 26 are shown; however, in each of transport layers 24 and electron transport layers 26, a hole injection layer and an electron injection layer are formed by lamination, respectively.

The thus-configured light emitting parts are covered with sealing layer 29 made of such as silicon nitride. In addition, on top of sealing layer 29, sealing substrate 31 such as a transparent glass substrate or a transparent flexible resin substrate is bonded via bonding layer 30 over the entire sealing layer to seal the light emitting parts.

Here, for base substrate 21, its material may be appropriately selected depending on the application purpose, without particular restrictions in terms of shape, material, and size. For example, it may be a glass substrate such as a non-alkali glass or soda glass substrate, a silicon substrate, or a metal substrate. Moreover, being targeted at light weight and/or flexible performance, a polymeric material may be used for the substrate. For the polymeric material, there are suited polyethylene terephthalate, polycarbonate, polyethylene naphthalate, polyamide, polyimide, and the like.

Other known polymeric materials for the substrate may be used including an acetate resin, an acryl resin, polyethylen, polypropylene, a polyvinylchloride resin, and the like. When the polymeric material is used for the substrate, the method of manufacturing the device is such that the polymeric material is formed by coating or bonding on a stiff substrate such as a glass one, followed by forming the organic EL light-emitting elements on the polymeric material. After that, the stiff substrate such as the glass one is removed.

Anodes 23 are configured using, such as, a metal material with high conductivity including aluminum, an aluminum alloy, and copper, or alternatively using a metal oxide or a metal sulfide which is optically transparent and highly electric-conductive, including IZO, ITO, tin oxide, indium oxide, and zinc oxide. The formation of the anodes may employ a method of forming thin films including vacuum vapor deposition, sputtering, and ion plating.

Hole transport layers 24 are configured using, such as, a polyvinyl carbazole material, a polysilane material, a polysiloxane derivative, a phthalocyanine compound including copper phthalocyanine, or an aromatic amine compound. The formation of the hole transport layers can employ various kinds of coating method. The hole transport layers are formed with a thickness of about 10 nm to 200 nm. Moreover, the hole injection layer laminated on hole transport layers 24 is one that enhances injection of holes from anode 23. The hole injection layer is formed by sputtering with a metal oxide such as molybdenum oxide, vanadium oxide, or aluminum oxide, or alternatively with a metal nitride or a metal oxynitride.

Light emitting layers 25 is configured mainly with an organic material which shows fluorescence and/or phosphorescence. When required, a dopant is added to the light emitting layers to improve characteristics of the layers. As a polymeric organic material suitable for printing, there are used a polyvinyl carbazole derivative, a poly-para-phenylene derivative, a polyfluorene derivative, a polyphenylene vinylene derivative, or the like. The dopant is used to shift wavelengths of emitted light and/or to improve light-emission efficiency. A wide range of the dopants, dye-based and metal complex-based ones, have been developed. Moreover, when light emitting layers 25 are formed on a large size substrate, printing methods are suitable for the formation thereof. Among various printing methods, an inkjet method is favorably used to form light emitting layers 25 with a thickness of about 20 nm to 200 nm.

Electron transport layers 26 are configured with a material including a benzoquinone derivative, a polyquinoline derivative, an oxadiazole derivative. The electron transport layers are formed through film formation by, such as, vacuum vapor deposition or coating application, to have a thickness of commonly about 10 nm to 200 nm. Moreover, the electron injection layers are formed, by vacuum vapor deposition or coating application, with a material including barium, phthalocyanine, and lithium fluoride.

Cathodes 27 are formed with a different material depending on the type of output direction of emitted light. For the type in which the emitted light is output from the cathode 27 side, the material is an optically-transparent and conductive material such as ITO, IZO, tin oxide, or zinc oxide. For the type in which the emitted light is output from the anode 23 side, the material is platinum, gold, silver, copper, tungsten, aluminum, an aluminum alloy, or the like. The cathodes are formed through film formation by, such as, sputtering or vacuum vapor deposition, to have a thickness of about 50 nm to 500 nm.

Banks 28 have a structure needed for filling each region with a sufficient amount of a solution containing the material of light emitting layers 25, and are formed in a predetermined shapes by photolithography. By controlling the shapes of banks 28, it is possible to define the shapes of the sub-pixels of the organic EL light-emitting part.

Sealing layer 29 is formed by forming a film of silicon nitride, and its film formation can employ a CVD (Chemical Vapor Deposition) method.

As described above, in the EL display device, the formation of part or all of the elements constituting the panel part, such as thin-film transistor array device 22 and electron transport layers 26 of the light emitting parts, employs the methods of forming films with the respective vapor deposition equipment.

Figure 4:
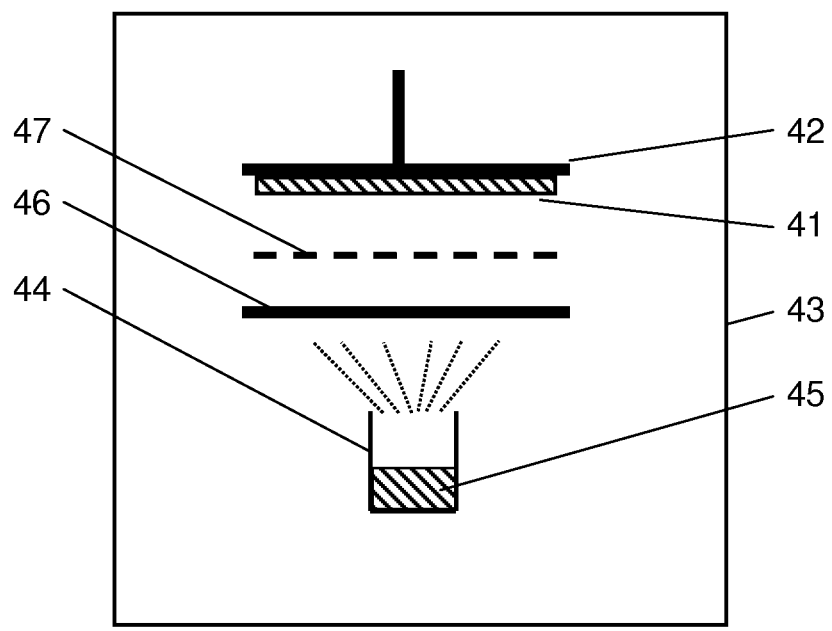
FIG. 4 is a schematic illustrative view of an example of a configuration of vacuum vapor deposition equipment for forming electron transport layers, through film formation, in a method of manufacturing the EL display device, according to the embodiment of the present technology.

FIG. 4 is a schematic illustrative view of an example of a configuration of the vacuum vapor deposition equipment for forming the electron transport layers, in the method of manufacturing the EL display device, according to the embodiment of the present technology disclosed herein.

As shown in FIG. 4, panel substrate 41 on which light emitting layers 25 are formed is transferred into a vacuum atmosphere inside of vapor deposition equipment 43, with the panel substrate being held by carrier jig 42. Vapor deposition equipment 43 includes vapor deposition source 44 with a long-length shape which corresponds to the width-directional length of panel substrate 41. In the inside of vapor deposition source 44, vapor deposition material 45 to form electron transport layers 26 is accommodated. In addition, between vapor deposition source 44 and panel substrate 41, shutter mechanism 46 and mask 47 are disposed.

Figure 5:
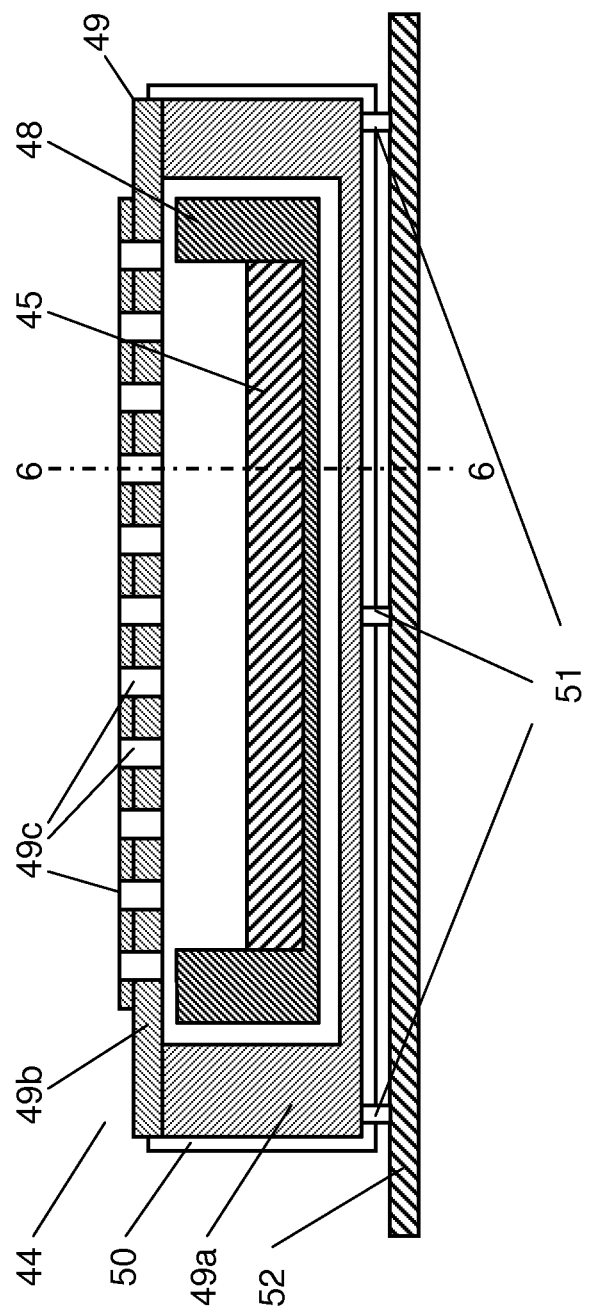
FIG. 5 is a view of a configuration of a vapor deposition source of the vapor deposition equipment used in the method of manufacturing the EL display device, according to the embodiment of the present technology.
Figure 6:
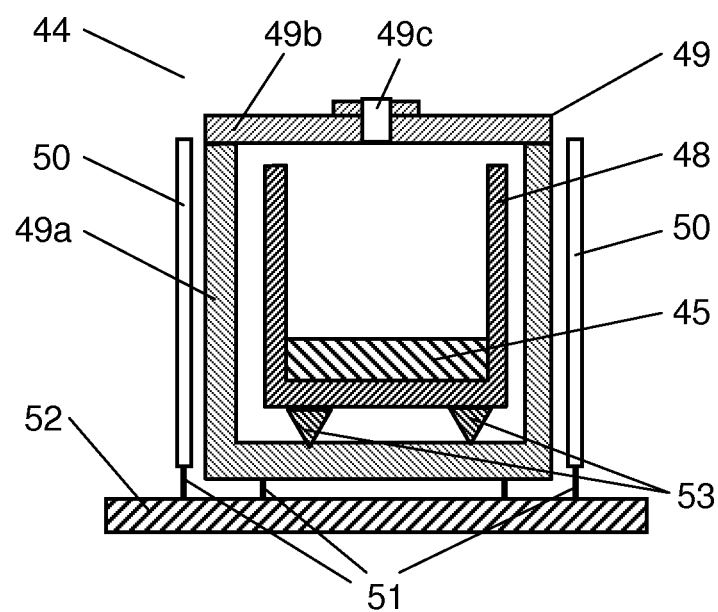
FIG. 6 is a cross-sectional view taken along line 6-6 in FIG. 5.

FIG. 5 is a view of a configuration of the vapor deposition source of the vapor deposition equipment used in the method of manufacturing the EL display device, according to the embodiment of the present technology. Specifically, FIG. 5 is a schematic cross-sectional view of the vapor deposition source with the long-length shape, when viewed from a side surface in the longitudinal direction. FIG. 6 is a schematic cross-sectional view taken along line A-A in FIG. 5.

As shown in FIGS. 5 and 6, vapor deposition source 44 of vapor deposition equipment 43 includes heat-resistant crucible 48 made of a ceramic material or the like in which vapor deposition material 45 to form electron transport layers 26 is accommodated, case 49 made of metal such as stainless steel or titanium inside which crucible 48 is disposed, heater 50 serving as a heating unit to heat vapor deposition material 45 accommodated inside crucible 48, and vapor-deposition source case 52 made of metal to hold case 49 and heater 50 via holders 51. Moreover, heater 50 is disposed to sandwich case 49 therein from the side surfaces of the case.

Case 49 includes container 49a to accommodate crucible 48 via a gap between the container and crucible 48, lid 49b removably attached to an opening of container 49a with bolts or the like, and a plurality of jetting ports 49c disposed in lid 49b along the longitudinal direction, through which vapors of vapor deposition material 45 jet out. Moreover, crucible 48 is supported, by supporters 53, on the bottom part of container 49a of case 49.

In this way, crucible 48 is accommodated in container 49a of case 49 to have the gap between the crucible and the container, and to have a reduced contact area therebetween by using supporters 53. This allows the prevention of crucible 48 from being fastened to case 49 via vapor deposition material 45.

The method according to the present technology disclosed herein employs vapor deposition source 44 of vapor deposition equipment 43 shown in FIGS. 5 and 6 to form electron transport layers 26 on panel substrate 41, through the film formation, by heating vapor deposition material 45 accommodated in crucible 48 to cause the vapors to jet out from jetting ports 49c of case 49.

Moreover, case 49 of vapor deposition source 44 has the configuration that includes container 49a to accommodate crucible 48 with the gap between the container and crucible 48, and lid 49b removably attached to the opening of container 49a and having jetting ports 49c through which the vapors of vapor deposition material 45 jet out. This configuration allows the prevention of crucible 48 from being fastened to case 49 via vapor deposition material 45. On top of that, case 49 is such that lid 49b having jetting ports 49c is removable from container 49a accommodating the crucible 48, which allows easy maintenance of the lid when jetting ports 49c are contaminated.

This configuration allows the formation of high quality films when the vapor deposition equipment is used to form the elements constituting the panel part, leading to improved yields in manufacturing the EL display devices.

Note that, in the embodiment, although the descriptions have been made using the top-emission type device which has the structure easy to realize higher definition, the present technology disclosed herein is also effective for a bottom-emission type structure.

As described above, the aforementioned embodiments have been described for exemplifying the technology disclosed in the present technology disclosed herein. However, the technology of the present disclosure is not limited to the embodiments, and may be applied to other embodiments which have been subjected to changes and modifications, replacements, additions, omissions, or the like.

As described above, the technology according to the present technology disclosed herein is effective for increasing yields in manufacturing the EL display devices.

What is claimed is:

1. A method of manufacturing an EL display device having a panel part, the panel part comprising:
    a light emitting part in which a plurality of pixels are arrayed, and
    a thin-film transistor array device to control light emission of the light emitting part,
    the method comprising forming an element constituting the panel part by using a vapor deposition equipment, wherein the vapor deposition equipment includes:
        a crucible configured to accommodate a vapor deposition material,
        a metal case configured to dispose the crucible therein, and
        a heating unit configured to heat the vapor deposition material in the crucible;
    the metal case includes:
        a container configured to accommodate the crucible with a gap between the container and the crucible, and
        a lid configured to be removably attached to an opening of the container, and having a jetting port for vapors of the vapor deposition material to jet out; and
    the crucible is supported by a supporter with a gap between the crucible and a bottom part of the container of the metal case such that the gap extends from the crucible to the bottom part of the container of the metal case, wherein the supporter is arranged inside the gap and the heating unit is arranged outside the gap.

2. The method of manufacturing the EL display device according to claim 1, wherein the vapor deposition equipment includes a vapor-deposition source case to hold the metal case and the heating unit.

3. The method of manufacturing the EL display device according to claim 1, wherein the heating unit is disposed to sandwich the metal case at side surfaces of the metal case.

4. The method of manufacturing the EL display device according to claim 1, wherein the vapor deposition equipment includes a vapor-deposition source case to hold the metal case and the heating unit via a holder.

5. A vapor deposition equipment used for forming an element constituting a panel part of an EL display device, the panel part comprising:
    a light emitting part in which a plurality of pixels are arrayed,
    a thin-film transistor array device to control light emission of the light emitting part,
    wherein the vapor deposition equipment includes:
        a crucible configured to accommodate a vapor deposition material,
        a metal case configured to dispose the crucible therein, and
        a heating unit configured to heat the vapor deposition material in the crucible;
    the metal case includes:
        a container configured to accommodate the crucible with a gap between the container and the crucible, and
        a lid configured to be removably attached to an opening of the container, and having a jetting port for vapors of the vapor deposition material to jet out; and
    the crucible is supported by a supporter with a gap between the crucible and a bottom part of the container of the metal case such that the gap extends from the crucible to the bottom part of the container of the metal case, wherein the supporter is arranged inside the gap and the heating unit is arranged outside the gap.

6. The method of manufacturing the EL display device according to claim 1, wherein a width of the supporter decreases as the supporter extends away from the crucible.

7. The vapor deposition equipment according to claim 5, wherein a width of the supporter decreases as the supporter extends away from the crucible.

8. The method of manufacturing the EL display device according to claim 1, wherein the heating unit is arranged outside of the metal case.

9. The vapor deposition equipment according to claim 5, wherein the heating unit is arranged outside of the metal case.

10. The method of manufacturing the EL display device according to claim 1, wherein the crucible and metal case are arranged and configured such that the vapors exit the crucible and enter a space within the metal case before being jet out through the jetting port.

11. The vapor deposition equipment according to claim 5, wherein the crucible and metal case are arranged and configured such that the vapors exit the crucible and enter a space within the metal case before being jet out through the jetting port.

* * * * *